United States Patent [19]
Feldman

[11] Patent Number: 4,697,141
[45] Date of Patent: Sep. 29, 1987

[54] TESTING OF RF DIODE PHASE SHIFTERS

[75] Inventor: Paul H. Feldman, Center Moriches, N.Y.

[73] Assignee: Hazeltine Corporation, Greenlawn, N.Y.

[21] Appl. No.: 891,012

[22] Filed: Jul. 31, 1986

[51] Int. Cl.[4] ..................... G01R 31/02; H01Q 3/30
[52] U.S. Cl. ...................... 324/158 R; 324/158 D; 343/703
[58] Field of Search ............ 324/158 R, 158 D, 73 R; 343/703, 858; 342/374

[56] References Cited

U.S. PATENT DOCUMENTS 4,359,740 11/1982 Frazita ............................. 343/703
4,532,518  7/1985 Gaglione ......................... 343/703

FOREIGN PATENT DOCUMENTS 1185270 10/1985 U.S.S.R. ........................ 324/158 R

Primary Examiner—Ernest F. Karlsen
Attorney, Agent, or Firm—E. A. Onders; F. R. Agovino

[57] ABSTRACT

Proper operation of an RF diode digital phase shifter of the kind having a number of logic inputs to effect corresponding incremental shifts in the phase of an RF signal passing through the phase shifter, is determined by monitoring the voltages developed across resistance elements of driver stages associated with diodes of the phase shifter. Voltages developed across the diodes are monitored, while turning the driver stages on and off in certain sequences and comparing the levels of the monitored voltages with preset reference levels. The drive stages also can be tested by turning them on and off simultaneously. A fault condition is indicated when the monitored voltages deviate from preset levels.

8 Claims, 2 Drawing Figures

| IN 3 (180° BIT) | IN 2 (90° BIT) | IN 1 (45° BIT) | IN 0 (22.5° BIT) | SHORT OUTPUT | OPEN OUTPUT | DEVICE TESTED/ DIODE CHECK |
|---|---|---|---|---|---|---|
| ON | ON | ON | ON | OFF | ON | DRIVE & BITE CIRCUITS |
| ON | ON | ON | OFF | ON | ON | SHORTED 22.5° BIT |
| ON | ON | OFF | ON | ON | ON | SHORTED 45° BIT |
| ON | OFF | ON | ON | ON | ON | SHORTED 90° BIT |
| OFF | ON | ON | ON | ON | ON | SHORTED 180° BIT |
| OFF | OFF | OFF | OFF | ON | OFF | DRIVE & BITE CIRCUITS |
| OFF | OFF | ON | ON | ON | ON | OPEN 22.5° BIT |
| OFF | OFF | OFF | OFF | ON | ON | OPEN 45° BIT |
| OFF | ON | OFF | OFF | ON | ON | OPEN 90° BIT |
| ON | OFF | OFF | OFF | ON | ON | OPEN 180° BIT |

RESULTS FOR "PASS" (SHORT OUTPUT and OPEN OUTPUT columns)

FIG. 2

TESTING OF RF DIODE PHASE SHIFTERS

BACKGROUND OF THE INVENTION

1. Field of the Invention

The present invention relates generally to a method of and a system for testing of RF diode digital phase shifters, and particularly to an arrangement by which all phase shifting diodes and drive circuits of the phase shifter can be tested for proper operation while applying logic input signals to the phase shifter in certain patterns.

2. Description of the Known Art

Electronically controlled radio frequency (RF) phase shifters play an important role in, inter alia, microwave antenna systems of the kind in which a number of antenna elements are each driven from a common source of RF wave energy signals but at relative phases determined by the settings of individual phase shifters associated with each of the antenna elements. Such antenna systems, commonly known as phased array antennas, enable a beam of wave energy to be directed from the antenna elements at a desired angle relative to the antenna axis, even though the individual elements remain fixed in position. That is, by setting the phase shifts of the individual phase shifters associated with the antenna elements at certain initial phase shift settings, and then changing the settings of the phase shifters over successive time intervals in a predetermined pattern, it is possible to scan the main beam of wave energy radiated from the array without the need for mechanical rotation means for the antenna. An important application for phased array antennas requiring a high degree of reliability for the phase shifters incorporated with the antenna, is in microwave landing system (MLS) configurations in which at least two phased array antennas are provided adjacent an aircraft runway, for causing both an azimuth (AZ) and an elevation (EL) beam to be scanned or steered rapidly "to" and "fro", and "up" and "down". Equipment on board an aircraft approaching the runway receives the beams as scanned by the phased array antennae and, based on synchronization information obtained from a third runway antenna, calculates the aircraft heading and angle of descent relative to the runway. It is thus clear that a failure of a phase shifter such as to cause an error in the predetermined scanning operation of either the AZ or EL antenna in an MLS system, would result in the aircraft equipment deriving false positional information during the critical runway approach time of flight.

RF phase shifters are generally of two kinds, viz., diode and ferrite. The former are employed with phased array antennae used in the MLS systems and other systems in which power supplied through the phase shifter to its associated antenna element (or elements) does not exceed about ten watts. The ferrite phase shifters are used in higher power applications.

An arrangement by which the supply of a RF wave energy signal to a malfunctioning phase shifter is cut off, to avoid serious degradation of the pattern of energy radiated by a phased array antenna, is disclosed in U.S. Pat. No. 4,359,740 issued Nov. 6, 1982 to R. F. Frazita and assigned to the assignee of the present invention. The disclosure of the '740 patent is incorporated in its entirety herein by reference. As mentioned in the '740 patent, diode phase shifters are known which include built-in test equipment (BITE) to determine the presence of malfunctioning diode elements in the phase shifter. The known BITE, however, has the following disadvantages.

Diode phase shifters typically have a number (e.g., four) of logic input terminals and a corresponding number of phase shifting networks to carry out a certain incremental relative phase shift between a radio frequency signal entering the network and the signal as it leaves the network. For example, a four-bit phase shifter includes four separately driven networks for providing incremental phase shifts of $22\frac{1}{2}°$, $45°$, $90°$ and $180°$. The known test circuitry allowed for testing of only one or two of the four phase shifting networks in the typical diode phase shifter and, moreover, could not detect the presence of a single open diode element in any of the networks. Test evaluations were performed only on the basis of the attainment of certain test voltages or currents, but not both.

SUMMARY OF THE INVENTION

An object of the invention is to overcome the above and other shortcomings in the testing of RF phase shifter diode elements while the elements remain in circuit in an associated phase shifter.

Another object of the invention is to provide for the testing of phase shifter diode elements in such a manner that the diode element or elements responsible for a fault condition can be readily identified so as to facilitate a quick repair of the phase shifter and allow it to return to service in an important application such as a MLS.

A further object of the invention is to provide a test method and system by which a malfunctioning drive stage or circuit among a number of like circuits in a phase shifter can be identified to facilitate quick repair.

Another object of the invention is to provide a fail-safe technique for testing the proper operation of an RF diode phase shifter in which all the diode elements, their associated drive stages or circuits and test circuitry incorporated in the phase shifter are called into operation by applying a sequence of control logic inputs to the phase shifter, monitoring voltages and currents developed in response to the inputs, and comparing the monitored levels with preset reference levels.

According to the invention, a method of testing for proper operation of a RF phase shifter of the kind in which a number of diode means are selectively forward and reverse biased to cause corresponding incremental shifts in the phase of a RF wave energy signal passing through the phase shifter, includes driving each of the diode means with a drive stage energized by applying a supply voltage through a series resistance element thereby causing a voltage to develop across the resistance element proportional to current supplied to the diode means when the drive stage is turned on to forward bias the diode means, monitoring the voltage across the series resistance element, establishing a normal forward bias current drawn by the diode means when driven by its drive stage and determining a corresponding first normal voltage across the series resistance element when the drive stage is turned on, setting a first reference voltage corresponding to the first normal voltage, selecting one of the diode means for testing of an open circuit condition, turning on the drive stage with which the selected diode means is associated while turning off all remaining drive stages of the phase shifter, testing for the existence of an open circuit for the selected diode means by comparing the voltage monitored in its drive stage with the first reference voltage, selecting another one of the diode means for testing of an open circuit condition, turning on the drive stage with which the other selected diode means is associated while turning off the remaining drive stages, and repeating the foregoing testing step thereby testing for an open circuit condition for the other selected diode means.

According to another aspect of the invention, a system for testing the operation of a diode phase shifter includes a number of diode drive circuits each for providing either a forward bias current or a reverse bias voltage from an output terminal to corresponding diode means of the phase shifter in response to an input logic signal, each drive circuit including a series resistance element through which the forward bias current passes when the drive circuit is turned on by the input logic signal, first sense means coupled across each of the resistance elements of the drive circuits for sensing a voltage proportional to current passing through the elements, means for setting a first reference voltage corresponding to the voltage across each of the resistance elements when a normal forward bias current is drawn by the diode means and for providing a first reference voltage, first compare means coupled to the first sense means and the first reference voltage output to compare the voltage across the resistance element of a selected drive circuit with the first reference voltage, first logic signal means coupled to the inputs of the drive circuits for turning the selected drive circuit on while turning the remaining drive circuits off, and open circuit detect means coupled to the first compare means to indicate an open circuit condition for the diode means which is driven by the selected drive circuit.

The various features of novelty which characterize the invention are pointed out with particularity in the claims annexed to and forming a part of the present disclosure.

For a better understanding of the invention, its operating advantages and specific objects attained by its use, reference should be had to the accompanying drawing and descriptive matter in which there is illustrated and described a preferred embodiment of the invention.

BRIEF DESCRIPTION OF THE DRAWING

In the drawing:

FIG. 2 is a table showing a sequence of logic inputs and outputs associated with the circuitry of FIG. 1, by which a defective diode element or a fault in a component of the circuitry can be determined.

DETAILED DESCRIPTION OF THE INVENTION

Figure 1:
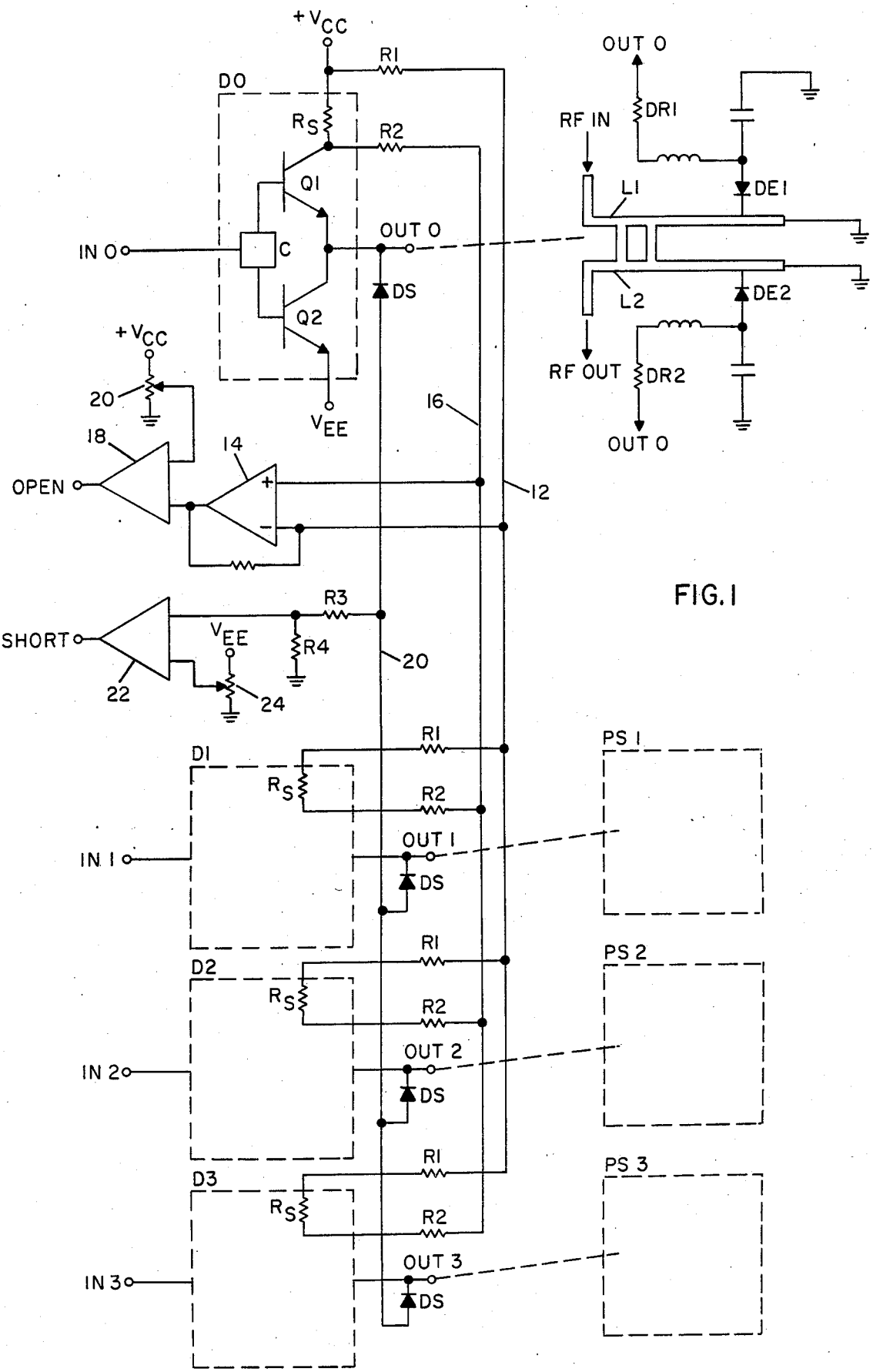
FIG. 1 is an electrical schematic diagram of a four bit diode phase shifter with test circuitry according to the invention.

FIG. 1 is an electrical schematic diagram of a four-bit diode phase shifter, including built-in test circuitry (BITE) according to the present invention. At the upper-right hand side of FIG. 1 is a RF diode strip line phase shifting network PS0, including two diode elements DE1, DE2.

A radio frequency signal RF IN enters one port of the network PS0 and travels along a conducting line L1. As is understood by those skilled in the art, the energy of the signal RF IN is coupled into an adjacent conducting line L2 and exits from an output port of the network PS0 as RF OUT. The phase relation between RF OUT and RF IN can be altered by causing a forward bias current to flow through the diode elements DE1, DE2 through associated bias resistors DR1, DR2. The diode elements DE1, DE2 are of the PIN type, and the bias resistors DR1, DR2 each have a typical value of 130 ohms. Depending on the physical dimensions of the conducting lines L1, L2, their spacing and the connection points between the diode elements DE1, DE2 and the lines L1, L2, the degree of relative phase shift between RF OUT and RF IN when the diode elements are turned off by a reverse bias voltage and when the diode elements are forward biased, can be preset. A four-bit phase shifter as shown in FIG. 1 provides for selectable, incremental relative phase shifts of 22.5°, 45°, 90° and 180°, in accordance with input logic signals applied to input terminals IN0, IN1, IN2 and IN3.

A drive circuit D0 for driving the diode elements DE1, DE2, selectively on and off, appears at the upper-left hand portion of FIG. 1. The drive circuit includes a pair of output transistors Q1, Q2 connected in series with a positive supply voltage $V_{CC}$ and a negative supply voltage $-V_{EE}$. A series resistance element RS is in the collector circuit of transistor Q1. A control circuit C drives the base or control electrodes of the transistors Q1, Q2 selectively on and off in accordance with the input logic signal IN0. An output terminal OUT 0 corresponding to a connection point between the emitter of transistor Q1 and the collector of transistor Q2, is connected to each of the diode element bias resistors DR1, DR2 associated with the phase shifting network PS0.

When an input logic signal IN0 representing that no incremental relative phase shift is to be provided by the network PS0, the control circuit C turns transistor Q1 off and turns transistor Q2 on, thereby causing the negative supply voltage $-V_{EE}$ to appear at the output terminal OUT 0. The negative potential is then applied through the bias resistors DR1, DR2 to back bias each of the diode elements DE1, DE2. If an incremental relative phase shift, e.g., 22½° is to be inserted by the network PS0, an input logic signal IN0 is applied to drive circuit D0 causing circuit C to forward bias the diode elements DE1, DE2 by turning transistor Q1 on and transistor Q2 off. In such state, the positive supply voltage $V_{cc}$ is applied by transistor Q1 through the series resistance element RS to the output terminal OUT 0, thus to forward bias the diode elements DE1, DE2 through the associated bias resistors DR1, DR2.

Three additional phase shifting networks PS1, PS2 and PS3 are represented at the right-hand side of FIG. 1, wherein each of the networks is constructed and arranged to provide relative incremental phase shifts of, e.g., 45°, 90° and 180°. Three additional drive circuits D1, D2 and D3 each of which are identical to the drive circuit D0, are also provided for driving corresponding ones of the phase shifting networks PS1–PS3.

A typical level for the positive supply voltage $V_{CC}$ is 5.0 volts, and for the negative supply voltage $-V_{EE}$, about $-15.0$ volts Four resistors R1 are each connected at one end to the high or supply voltage side of a corresponding series resistance element RS of the four drive circuits D0–D3. The other ends of the resistors R1 are connected to a common conductor 12 which also connects to the inverting input of an amplifier 14.

Another set of four resistors R2 are each connected at one end to the collector sides of the resistance elements RS in the four drive circuits D0–D3, and are connected at their remaining ends to a conductor 16. The conductor 16 is also connected to the noninverting input of the amplifier 14. The output of amplifier 14 is applied to one input of a comparator 18. The remaining input terminal of the comparator 18 is connected to a preset reference level obtained from a potentiometer 20 or equivalent voltage reference setting means coupled to the positive supply voltage $V_{CC}$.

Four sensing diodes DS each have their cathode terminals connected to corresponding output terminals OUT 0-OUT 3 of the drive circuits D0-D3. The anode terminals of each of the sensing diodes DS are connected to a common conductor 20. The conductor 20 is connected to the high end of a resistance voltage divider formed by resistors R3, R4. The connection point between the resistors R3, R4 is also connected to one input of a comparator 22. The remaining input of comparator 22 is connected to a preset negative reference voltage level obtained from a potentiometer 24 or equivalent reference voltage setting means coupled to the negative supply voltage $-V_{EE}$.

Each pair of resistors R1, R2 connected across an associated series resistance element RS, and the amplifier 14, serve as means for sensing a flow of current through the collector of transistor Q1 of each of the drive circuits D0-D3, since such current flow will cause a voltage to develop across each of the resistance elements RS which voltage is applied through the resistors R1, R2 to the input terminals of the amplifier 14 to produce a corresponding output signal. When any of the drive circuits D0-D3 has an input logic signal applied so as to turn an associated phase shifting network in an on state, and both of the diode elements DE1, DE2 of the phase shifting network are not open-circuited, then the collector current through the resistance element of the particular drive circuit will conduct the total of the two forward bias currents through each of the diode elements. Since the normal operating forward bias current for each of the diode elements DE1, DE2 is known, the resulting voltage developed across the resistance element RS is also a known quantity. Accordingly, the output of amplifier 14 which represents the voltage across the resistance element should match a preset reference voltage corresponding to the forward bias current of a single phase shifting diode element multiplied by two (for two diode elements in each network) and multiplied by the value of the series resistance element RS in ohms (Ohm's Law).

A method of testing for non-open circuited diode elements for each of the phase shifting networks PS0-PS3 thus would entail the turning of the drive circuit associated with the phase shifting network under test in an on or drive state, while turning the remaining drive circuits in an off state. If a match is obtained between the output of comparator 14 and the preset reference voltage applied to comparator 18, a signal will appear at the terminal labeled OPEN in FIG. 1. If one of the diode elements of a driven phase shifting network is open, then the current through the resistance RS of the associated drive circuit is only ½ the normal operating current corresponding to an on state for the drive circuit. Thus, the voltage sensed by the resistors R1, R2 and applied to the input of amplifier 14 will result in an amplifier output voltage which is less than that preset at the input of the comparator 18, and no signal will appear at the OPEN terminal. Likewise, if both diode elements of the network under test are open-circuited, or if the transistor Q1 of the associated drive stage is open-circuited, then no match signal will appear at the OPEN terminal when an input logic signal indicative of an on state, is applied to the drive circuit.

If either one of the diode elements DE1, DE2 of a selected phase shifting network is short-circuited, or if the transistor Q2 of an associated drive circuit is open so as to prevent a proper reverse bias voltage from being applied by the drive circuit to the diode elements, such a condition is ascertained as follows.

The drive circuit associated with the phase shifting network to be tested, has an input logic signal corresponding to an off state applied to its input terminal. The remaining drive circuits each have an input logic signal corresponding to an on state applied to their input terminals. If neither one of the diode elements under test is short-circuited, a negative or reverse bias voltage near the value $-V_{EE}$ will appear at the output terminal of the associated drive circuit. The negative output voltage is sensed by the diode DS associated with the drive circuit and a portion of the negative output voltage is applied to one input of the comparator 22 by the resistor divider network R3, R4. Positive voltages appearing at the outputs of the remaining drive circuits are blocked from being applied across the divider network R3, R4 by the remaining sensing diodes DS. If the negative or reverse bias voltage sensed for the drive circuit and phase shifting network under test matches the negative reference level set at the remaining input of the comparator 22, a signal will appear at the output terminal labeled SHORT, indicating a "pass" of the short-circuit test. If either diode element of the network under test is short-circuited, or if the transistor Q2 of the associated drive circuit is open, the output voltage developed by the drive circuit will not be sufficiently negative to match the level preset by the pot 24, and no signal will appear at the SHORT terminal so as to indicate a "fail" on the short-circuit test.

FIG. 2 is a table which sets out ten different input logic signal states for testing short and open-circuited diode elements of four phase shifting networks with associated drive circuits, and for testing of fault conditions in the drive circuits and/or the built-in test equipment shown in FIG. 1.

The measurement technique of the present invention provides full phase shifting network and driver circuit diagnostics with simple hardware and software control. Operation faults can be detected without the need for energizing a phase shifter with RF power. In addition, all bits of a phase shifter are tested by turning each bit on and off one at a time, and monitoring the results. Such "exercising" of bits allows not only for testing of a phase shifter of any length, but also indicates which, if any, bit has an associated fault. Through the combination of measuring diode element current and voltages, and the exercising of each phase shifter bit, the present measurement technique provides for tests which up to now were difficult if not impossible to perform on diode type phase shifters. Further, it is possible to detect a failure in the phase shifter drive circuits or in the circuitry used for implementing the present measurement technique, as well.

While the foregoing description represents a preferred embodiment of the present invention, it will be obvious to those skilled in the art that various changes and modifications may be made, without departing from the spirit and scope of the present invention.

What is claimed is:

1. A method of testing for proper operation of a radio frequency phase shifter of the kind in which a number of diode means are selectively forward and reverse biased thereby effecting corresponding incremental shifts in the phase of an RF wave energy signal passing through the phase shifter, comprising:

(a) driving each of said diode means with a drive stage which is energized by applying a supply voltage to the drive stage through a series resistance element thereby causing a voltage to be developed across the resistance element which is proportional to current supplied to the diode means when the drive stage is turned on and the diode means is forward biased;

(b) monitoring the voltage developed across each said series resistance element;

(c) establishing a normal forward bias current which is drawn by each of the diode means when driven by its drive stage and determining a corresponding first normal voltage which develops across the series resistance element of the drive stage when turned on;

(d) setting a first reference voltage corresponding to said first normal voltage, (e) selecting one of the diode means for testing of an open circuit condition;

(f) turning on the drive stage with which the selected diode means is associated while turning off the drive stages of all remaining diode means of the phase shifter;

(g) testing for the existence of an open circuit condition for the selected diode means by comparing the voltage monitored in its drive stage with said first reference voltage;

(h) selecting another one of the diode means of the phase shifter for testing of an open circuit condition, (i) turning on the drive stage with which the other selected diode means is associated while turning off all remaining drive stages; and (j) repeating step (g) thereby testing for the existence of an open circuit condition for the other selected diode means.

2. The method of claim 1, including forming each diode means as a two-branch parallel circuit with a diode in each branch, carrying out the first reference voltage setting step (d) to correspond to the normal voltage which develops in an associated drive stage when both diodes of each diode means simultaneously draw a normal operating current from the drive stage, and testing for the existence of an open circuit condition for either one of the diodes by comparing the voltage monitored in the drive stage with said first reference voltage.

3. The method of claim 1, including testing for the existence of a short circuit condition for the select diode means by monitoring the voltage developed across each diode means, setting a second reference voltage corresponding to a normal operating voltage present across each diode means when its drive stage is turned off, turning off the drive stage with which the selected diode means is associated while turning on the drive stages of all remaining diode means of the phase shifter, and comparing the voltage monitored across the selected diode means with said second reference voltage.

4. The method of claim 3, including testing for the existence of a circuit fault condition by simultaneously turning all the drive stages on and off while monitoring voltages developed across said series resistance elements and said diode means, and indicating a fault condition when the monitored voltages deviate from preset levels.

5. The method of claim 3, including selecting another one of the diode means of the phase shifter for testing of a short circuit condition, turning off the drive stage with which the other selected diode means is associated while turning on all remaining drive stages, and repeating said second reference voltage comparing step thereby testing for the existence of a short circuit condition for the other selected diode means.

6. A system for testing the proper operation of a diode digital phase shifter of the type which shifts incrementally the phase of an RF wave energy signal passing through the phase shifter in response to corresponding bits of information applied to inputs of diode drive circuits, comprising:

a plurality of diode drive circuits each for providing from an output terminal a selected one of a forward bias current and a reverse bias voltage to corresponding diode means of the phase shifter in response to an input logic signal, each drive circuit including terminal means for connection to a supply voltage and a series resistance element coupled to said terminal means wherein said forward bias current passes through said resistance element when the drive circuit is turned on by said input logic signal;

first sense means coupled across each of the series resistance elements of said drive circuits for sensing a voltage corresponding to the current passing through each of said elements;

means for setting a first reference voltage corresponding to a voltage developed across each of said resistance elements when a normal forward bias current is drawn by the diode means, and for providing a first reference voltage output;

first compare means coupled to said first sense means and said first reference voltage output for comparing the voltage across the resistance element of a selected one of said drive circuits with said first reference voltage;

first logic signal means coupled to the inputs of said drive circuits for turning the selected drive circuit on while turning the remaining drive circuits off; and open circuit detect means coupled to said first compare means for indicating an open circuit condition for the diode means which is driven by the selected drive circuit, in the absence of a match signal from said first compare means.

7. A system according to claim 6, including:

second sense means coupled to the output terminal of each of said diode drive circuits for sensing a voltage developed across an associated diode means;

means for setting a second reference voltage corresponding to a normal operating voltage present across each diode means when its drive circuit is turned off, and for providing a second reference voltage output;

second compare means coupled to said second sense means and said second reference voltage output for comparing the voltage across the diode means associated with a selected one of said diode drive circuits with said second reference voltage;

second logic signal means coupled to the inputs of said drive circuits for turning the selected drive circuit off while turning the remaining drive circuits on; and short circuit detect means coupled to said second compare means for indicating a short circuit condition of the diode means associated with the selected drive circuit, in the absence of a match signal from said second compare means.

8. A system according to claim 7, including system test logic signal means coupled to the inputs of said drive circuits for simultaneously turning all the drive circuits on and off to detect the presence of a circuit fault, and circuit fault detect means coupled to said first and said second sense means for indicating a fault condition in accordance with the outputs of said sense means when all the drive circuits are simultaneously turned on and off.

* * * * *